United States Patent
Okuno

(10) Patent No.: US 10,475,952 B2
(45) Date of Patent: Nov. 12, 2019

(54) GROUP III NITRIDE SEMICONDUCTOR LIGHT-EMITTING DEVICE

(71) Applicant: TOYODA GOSEI CO., LTD, Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/848,529

(22) Filed: Dec. 20, 2017

(65) Prior Publication Data

US 2018/0182914 A1 Jun. 28, 2018

(30) Foreign Application Priority Data

Dec. 28, 2016 (JP) ................. 2016-257144

(51) Int. Cl.
| | | |
|---|---|---|
| *H01L 33/00* | (2010.01) | |
| *H01L 33/20* | (2010.01) | |
| *H01L 33/60* | (2010.01) | |
| H01L 33/40 | (2010.01) | |
| H01L 33/42 | (2010.01) | |

(52) U.S. Cl.
CPC ........ *H01L 33/007* (2013.01); *H01L 33/0079* (2013.01); *H01L 33/20* (2013.01); *H01L 33/60* (2013.01); *H01L 33/405* (2013.01); *H01L 33/42* (2013.01); *H01L 2933/0083* (2013.01)

(58) Field of Classification Search
CPC ....... H01L 33/007; H01L 33/42; H01L 33/60; H01L 33/405; H01L 33/20
See application file for complete search history.

(56) References Cited

U.S. PATENT DOCUMENTS

| | | |
|---|---|---|
| 8,405,113 B2 | 3/2013 | Kazama |
| 2012/0025251 A1 | 2/2012 | Kazama |
| 2014/0054633 A1* | 2/2014 | Kim ................. H01L 33/58 257/98 |
| 2015/0228848 A1 | 8/2015 | Miyoshi et al. |
| 2016/0133796 A1* | 5/2016 | Hu ................... H01L 33/405 257/98 |

FOREIGN PATENT DOCUMENTS

| | | |
|---|---|---|
| JP | 2012-033695 A | 2/2012 |
| JP | 2015-153826 A | 8/2015 |

* cited by examiner

*Primary Examiner* — Selim U Ahmed
(74) *Attorney, Agent, or Firm* — McGinn IP Law Group, PLLC.

(57) ABSTRACT

There are provided a Group III nitride semiconductor light-emitting device having complicated irregularities on the light extraction surface. The light-emitting device comprises a substrate, a p-type semiconductor layer, a light-emitting layer, and an n-type semiconductor layer. The light-emitting device has protrusions extending upward from the surface of the n-type semiconductor layer on the n-type semiconductor layer. Each protrusion has a wall portion disposed so as to intersect with the surface of the n-type semiconductor layer. The wall portion has a first surface facing the n-type semiconductor layer. An angle between the first surface and the n-type semiconductor layer is 10° to 85°.

14 Claims, 9 Drawing Sheets

GROUP III NITRIDE SEMICONDUCTOR LIGHT-EMITTING DEVICE

BACKGROUND OF THE INVENTION

Field of the Invention

The technique disclosed in the present specification relates to a Group III nitride semiconductor light-emitting device.

Background Art

The semiconductor light-emitting device is a device to extract light emitted from the light-emitting layer to the outside. To efficiently extract the light emitted from the light-emitting layer, a light extraction surface is often formed at an interface between the device and the outside. Techniques of forming an unevenly shaped portion on the light extraction side of the substrate or forming an unevenly shaped portion on a surface of conductive oxide film such as ITO have been developed.

For example, Patent Document 1 discloses a semiconductor light-emitting device having a second cladding layer on which an unevenly shaped light extraction structure is formed (see FIG. 6 of Patent Document 1). This technique improves the light extraction performance (see paragraph [0010] of Patent Document 1).

Patent Document 1: Japanese Patent Application Laid-Open (kokai) No. 2012-33695

As disclosed in Patent Document 1, the unevenly shaped portion on the light extraction surface has recesses and protrusions appearing alternately. However, light extraction performance may be further improved by providing more complicated irregularities.

SUMMARY OF THE INVENTION

The technique disclosed in the present specification has been accomplished for solving problems involved in the aforementioned conventional technique. Accordingly, an object of the technique disclosed in the present specification is to provide a Group III nitride semiconductor light-emitting device having more complicated irregularities on the light extraction surface.

In a first aspect of the disclosure, there is provided a Group III nitride semiconductor light-emitting device comprising: a first semiconductor layer of a first conductive type, a light-emitting layer on the first semiconductor layer, and a second semiconductor layer of a second conductive type on the light-emitting layer. The Group III nitride semiconductor light-emitting device has first protrusions extending upward from the surface of the second semiconductor layer. Each first protrusion has a wall portion disposed so as to intersect with the surface of the second semiconductor layer. The wall portion has a first surface facing the second semiconductor layer. An angle between the first surface and the second semiconductor layer is 10° to 85°.

The Group III nitride semiconductor light-emitting device has a light extraction surface having complicated irregularities. At least a portion of light emitted from the light-emitting layer passes through the n-type semiconductor layer to the outside of the light-emitting device. The light then enters the wall portion of the first protrusion through the first surface, and then passes through the second surface of the wall portion of the protrusion to the outside of the light-emitting device. During this process, the light is effectively scattered. Thus, the light is effectively extracted to the outside in the Group III nitride semiconductor light-emitting device.

A second aspect of the disclosure is a specific embodiment of the Group III nitride semiconductor light-emitting device according to the first aspect, wherein the wall portion has a tubular shape. The inner diameter of the tubular wall portion increases in a direction away from the surface of the second semiconductor layer. In this case, the light is scattered in a wide range at the wall.

A third aspect of the disclosure is a specific embodiment of the Group III nitride semiconductor light-emitting device according to the first aspect, wherein the wall portion has a tubular shape. The inner diameter of the tubular wall portion decreases in a direction away from the surface of the second semiconductor layer. In this case, the light emitted from the light-emitting layer is scattered in a wider range.

A fourth aspect of the disclosure is a specific embodiment of the Group III nitride semiconductor light-emitting device according to the third aspect, wherein second protrusions are formed smaller in size than the first protrusions. Each second protrusion extends upward from the surface of the second semiconductor layer, and is disposed inside the tubular shape of the first protrusion. Accordingly, the light extraction surface has more complicated irregularities.

A fifth aspect of the disclosure is a specific embodiment of the Group III nitride semiconductor light-emitting device according to the third or fourth aspect, wherein the first protrusion has a flat portion in contact with the second semiconductor layer. The wall portions are connected to one another via the flat portion.

A sixth aspect of the disclosure is a specific embodiment of the Group III nitride semiconductor light-emitting device according to the first aspect, wherein the first protrusion has a flat portion in contact with the second semiconductor layer. Each wall portion has two plates facing each other. A distance between the plates decreases in a direction away from the surface of the second semiconductor layer.

A seventh aspect of the disclosure is a specific embodiment of the Group III nitride semiconductor light-emitting device according to the fifth aspect, wherein the wall portion has first through holes, and the flat portion has second through holes. The density of the first through holes is higher than that of the second through holes. Light is scattered even at the first through holes and the second through holes. Thus, the light-emitting device exhibits considerably higher light extraction performance than the conventional one.

An eighth aspect of the disclosure is a specific embodiment of the Group III nitride semiconductor light-emitting device according to the fifth aspect, wherein the both ends of each first through hole are open, and one end of each second through hole is blocked with the second semiconductor layer. In this case, the semiconductor layer exhibits very low threading dislocation density. Thus, the semiconductor layer exhibits good crystallinity.

A ninth aspect of the disclosure is a specific embodiment of the Group III nitride semiconductor light-emitting device according to the fifth aspect, wherein the thickness of the flat portion of each first protrusion is greater than the thickness of the wall portion of each first protrusion.

A tenth aspect of the disclosure is a specific embodiment of the Group III nitride semiconductor light-emitting device according to the first aspect, wherein the first protrusions are arranged in a non-periodic manner on the second semiconductor layer.

An eleventh aspect of the disclosure is a specific embodiment of the Group III nitride semiconductor light-emitting device according to the first aspect, wherein each first protrusion has a thickness of 0.25 nm to 100 nm at its thickest position.

A twelfth aspect of the disclosure is a specific embodiment of the Group III nitride semiconductor light-emitting device according to the first aspect, wherein each first protrusion has a facet plane on the surface thereof. In such a case, the first protrusion has a stable form.

In the present specification, there are provided a Group III nitride semiconductor light-emitting device having complicated irregularities on the light extraction surface.

BRIEF DESCRIPTION OF THE DRAWINGS

Various other objects, features, and many of the attendant advantages of the present technique will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
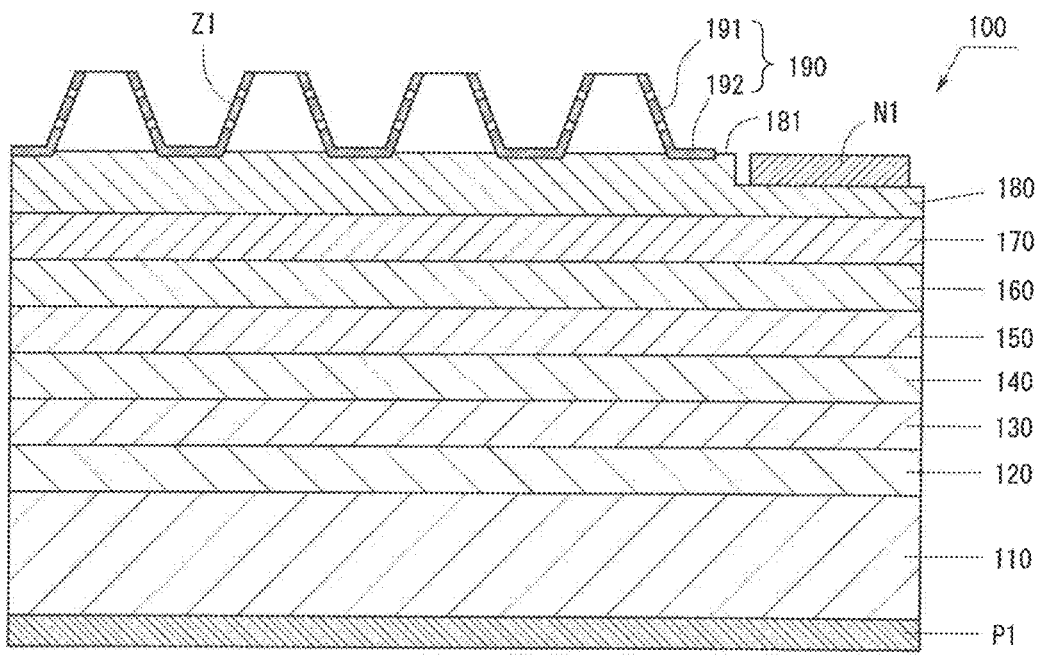
FIG. 1 schematically shows the configuration of a light-emitting device of a first embodiment.

Specific embodiments will next be described with reference to the drawings by taking, as an example, a semiconductor light-emitting device and a method for producing a semiconductor light-emitting device. However, the technique disclosed in the present specification should not be limited to these embodiments. In the below-described semiconductor light-emitting device, the layered structure of each layer and the structure of each electrode are shown for an exemplary purpose. Needless to say, the layered structure may differ from that described below in the embodiments. The thickness proportion of each layer which is schematically shown in the drawings does not correspond to its actual value. In some drawings, the thickness is not taken into account.

(First Embodiment)
1. Semiconductor Light-emitting Device

FIG. 1 schematically shows the configuration of a semiconductor light-emitting device 100 of a first embodiment. The light-emitting device 100 is a Group III nitride semiconductor light-emitting device. The growth substrate of the light-emitting device 100 is removed by laser lift-off. Therefore, the growth substrate such as a sapphire substrate is not left in the light-emitting device 100. A light extraction surface Z1 is located on the side of an n-type semiconductor layer.

As shown in FIG. 1, the light-emitting device 100 includes a p-electrode P1, a support substrate 110, a first conductive metal layer 120, a conductive bonding layer 130, a second conductive metal layer 140, an electrically conductive reflective film 150, a p-type semiconductor layer 160, a light-emitting layer 170, an n-type semiconductor layer 180, protrusions 190, and an n-electrode N1.

The p-electrode P1 is an electrode formed on the support substrate 100. The p-electrode P1 is formed of a combination of one or more of, for example, Ni, Au, Ag, and Co. Needless to say, the p-electrode P1 may be formed of any other material. The p-electrode P1 is conducted to the p-type semiconductor layer 160.

The support substrate 110 is a substrate for supporting semiconductor layers. The support substrate 110 is a conductive support substrate. The support substrate 110 is formed of, for example, Si. The support substrate 100 may be formed of GaAs, Ge, or other metal.

The first conductive metal layer 120 is provided for improving adhesion between the support substrate 110 and the conductive bonding layer 130. The first conductive metal layer 120 is formed of, for example, Au.

The conductive bonding layer 130 is a layer containing a bonding material to bond the support substrate 110 and the semiconductor layer formed in the production process of the light-emitting device 100. After the light-emitting device 100 was produced, electric current needs to be applied to the light-emitting layer. Therefore, the conductive bonding layer 130 is formed of a conductive material such as AuSn solder. Needless to say, the conductive bonding layer 130 may be formed of other solder alloy.

The second conductive metal layer 140 is provided for improving adhesion between the conductive bonding layer 130 and the electrically conductive reflective film 150. The second conductive metal layer 140 also prevents the solder of the conductive bonding layer 130 from diffusing to the semiconductor layer. The second conductive metal layer 140 is formed of, for example, Au.

The electrically conductive reflective film 150 is provided for reflecting light emitted from the light-emitting layer 170. Needless to say, the electrically conductive reflective film 150 exhibits electrical conductivity so as to apply sufficient electric current to the light-emitting layer 170 of the light-emitting device. The electrically conductive reflective film 150 has both the properties of reflectiveness to reflect light and conductivity to apply electric current.

The electrically conductive reflective film 150 is formed of, for example, Ag, Al, and alloy containing Al or Ag as a main component. The electrically conductive reflective film 150 may be formed of Rhodium (Rh), Ruthenium (Ru), Platinum (Pt), Palladium (Pd), or an alloy containing at least one selected from a group consisting of these. The electrically conductive reflective film 150 may be a distributed bragg reflective film (DBR) formed of a plurality of layers made of two materials with different refractive indices.

The p-type semiconductor layer 160 is a first semiconductor layer of a first conductive type above the substrate 110. The p-type semiconductor layer 160 is provided to prevent diffusion of electrons to the electrically conductive reflective film 150, thereby increasing the emission efficiency of the light-emitting layer 170. The p-type semiconductor layer 160 has, for example, a p-side cladding layer and a p-type contact layer from the light-emitting layer side.

The light-emitting layer 170 is disposed on the p-type semiconductor layer 160. The light-emitting layer 170 emits light through recombination of electrons and holes. The light-emitting layer 170 has a multiple quantum well structure in which a well layer having a small bandgap and a barrier layer having a large bandgap are alternately formed. The light-emitting layer may be a single quantum well layer. These are merely examples. The light-emitting layer may have any other structure.

The n-type semiconductor layer 180 is a second semiconductor layer of a second conductive type on the light-emitting layer 170. The n-type semiconductor layer 180 is a contact layer in contact with the n-electrode N1 and a layer to suppress stress from being applied to the light-emitting layer 170. The n-type semiconductor layer 180 is a layer to prevent diffusion of In from the light-emitting layer 170. For example, the n-type semiconductor layer 180 has an n-side superlattice layer, an n-side electrostatic breakdown preventing layer, and an n-type contact layer from the light-emitting layer 170 side.

The protrusions 190 extend upward from the surface of the n-type semiconductor layer 180 on the n-type semiconductor layer 180. The protrusions 190 are formed of AlGaN. The protrusion will be described in detail hereinbelow.

The n-electrode N1 is formed on the n-type semiconductor layer 180. If the protrusions 190 are formed of an electrically conductive material, the n-electrode N1 can be formed on the protrusions 190. The n-electrode N1 is formed of a combination of one or more of, for example, Ni, Au, Ag, and Co. Thus, the n-electrode N1 is conducted to the n-type semiconductor layer 180. The n-electrode N1 is a metal electrode and is generally non-transparent.

2. Protrusion 2-1. Structure of Protrusion

The protrusions 190 and the n-type semiconductor layer 180 form the light extraction surface Z1. The protrusions 190 are disposed on the n-type semiconductor layer 180. The protrusions 190 extend upward from a surface 181 of the n-type semiconductor layer 180. Each protrusion 190 has a wall portion 191 and a flat portion 192. The flat portion 192 is in contact with the n-type semiconductor layer 180. The wall portion 191 extends upward from the n-type semiconductor layer 180. The wall portion 191 is disposed so as to intersect with the surface of the n-type semiconductor layer 180.

2-2. Shape of Protrusion

Figure 2:
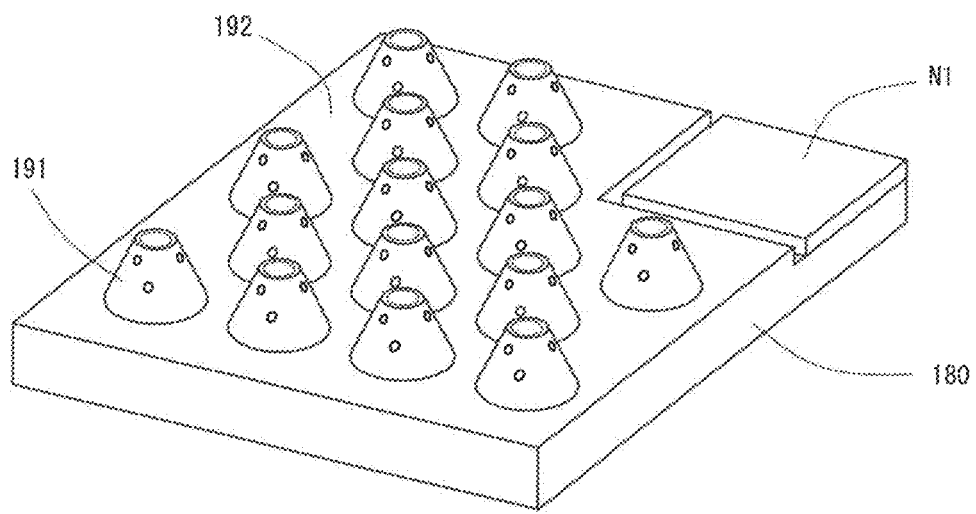
FIG. 2 is a perspective view of the light-emitting device of the first embodiment.

FIG. 2 is a perspective view of the light-emitting device 100. However, FIG. 2 is an enlarged view of a region from the n-type semiconductor layer 180 to the protrusions 190 and the n-electrode N1. The wall portions 191 are arranged on the n-type semiconductor layer 180 in a honeycomb pattern. Each wall portion 191 has a tapered tubular (approximately cylindrical) shape. As shown in FIGS. 1 and 2, the inner diameter of the tubular wall portion 191 decreases in a direction away from the surface 181 of the n-type semiconductor layer 180. As shown in FIG. 2, the surface 181 of the n-type semiconductor layer 180 is exposed in the interior of the tapered cylindrical wall portions 191, and the flat portion 192 is exposed at the exterior of the tapered tubular wall portions 191. The flat portion 192 is connected to the wall portions 191. The wall portions 191 are supported by the flat portion 192.

Figure 3:
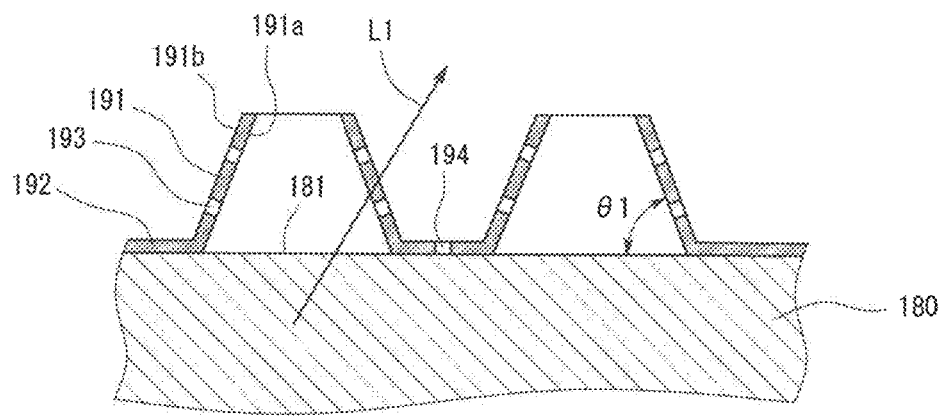
FIG. 3 is an enlarged view of a region around protrusions in the light-emitting device of the first embodiment.

FIG. 3 is an enlarged view of a region around the protrusions 190. As shown in FIG. 3, the wall portion 191 of each protrusion 190 has a first surface 191a and a second surface 191b. The first surface 191a faces the n-type semiconductor layer 180 of the light-emitting device 100. The second surface 191b faces the outside of the light-emitting device 100. The second surface 191b is opposite the first surface 191a. The inner diameter of each wall portion 191 decreases in a direction away from the surface 181 of the n-type semiconductor layer 180. The first surface 191a corresponds to the internal surface of the cylindrical tube tapered from the surface 181 of the n-type semiconductor layer 180.

The angle $\theta1$ between the first surface 191a and the n-type semiconductor layer 180 falls within a range of 10° to 85°. The angle $\theta1$ is preferably 30° to 80°, more preferably 45° to 65°. Thus, each protrusion 190 has the first surface 191a which faces the n-type semiconductor layer 180 and makes an acute angle with the n-type semiconductor layer 180.

The protrusions 190 are formed in a periodic manner. The wall portions 191 of the protrusions 190 have almost the same height. Thus, the height of one of the wall portions 191 as measured from the n-type semiconductor layer 180 falls within a range of ±10% of the average of the heights of the wall portions 191 as measured from the n-type semiconductor layer 180. The wall portions 191 are connected to one another via the flat portion 192.

2-3. Thickness of Protrusion

Each protrusion 190 has a thickness of 0.25 nm to 100 nm at its thickest position. The thickness is preferably 0.5 nm to 60 nm, more preferably 1 nm to 30 nm. The thickness of the flat portion 192 is preferably greater than that of the wall portion 191.

2-4. Through Hole of Protrusion

The wall portion 191 of each protrusion 190 has a plurality of through holes 193. The flat portion 192 of the protrusion 190 has a plurality of through holes 194. The density of the through holes 193 of the wall portion 191 is higher than that of the through holes 194 of the flat portion 192. In this case, each semiconductor layer has a low threading dislocation density; i.e., the semiconductor layer exhibits good crystallinity.

The both ends of each through hole 193 of the wall portion 191 are open. One end of each through hole 194 of the flat portion 192 is open. The other end of the through hole 194 of the flat portion 192 is blocked with the n-type semiconductor layer 180.

2-5. Effects of Protrusion

As shown in FIGS. 2 and 3, the light-emitting device 100 of the first embodiment has the light extraction surface Z1 having a complicated shape. Thus, as shown in FIG. 3, a portion of light L1 emitted from the light-emitting layer 170 passes through the n-type semiconductor layer 180 to the outside of the light-emitting device 100. The light L1 then enters the wall portion 191 of each protrusion 190 through the first surface 191a, and then passes through the second surface 191b of the wall portion 191 of the protrusion 190 to the outside of the light-emitting device 100. During this process, the light emitted from the light-emitting layer 170 is complicatedly reflected at the first surface 191a and the second surface 191b of the protrusion 190. Thus, the light-emitting device 100 exhibits high external quantum efficiency. The tubular shape of the protrusion 190 plays a role as an escape cone. Thus, the protrusion 190 effectively reflects the return light from the outside of the light-emitting device.

Each protrusion 190 has a plurality of through holes 193 and 194. Accordingly, the light extraction surface Z1 of the protrusion 190 has more complicated irregularities. Thus, the light-emitting device 100 exhibits very high external quantum efficiency.

3. Production Method for Semiconductor Light-emitting Device

3-1. Step of Preparing Growth Substrate

Figure 4:
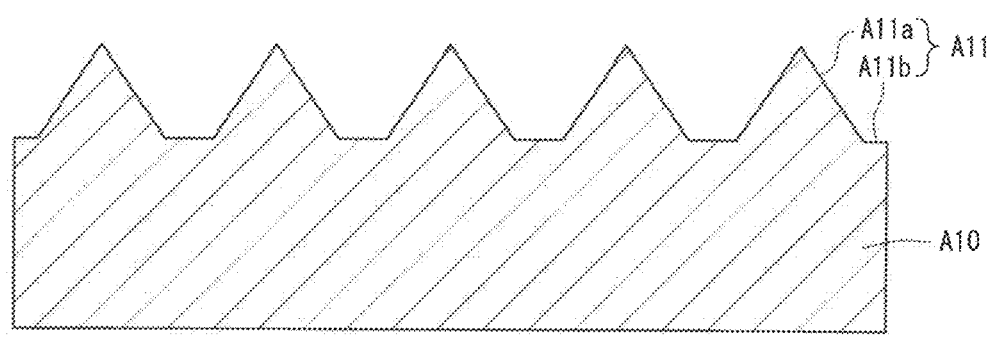
FIG. 4 illustrates a production method for the light-emitting device of the first embodiment (part 1)

Firstly, as shown in FIG. 4, a substrate A10 is prepared. The substrate A10 is a growth substrate used in the production method for semiconductor light-emitting device. The substrate A10 has an unevenly shaped portion A11. The unevenly shaped portion A11 has a plurality of protrusions A11a and a bottom portion A11b. The protrusions A11a have a conical shape. The protrusions A11a are arranged in a honeycomb pattern on the main surface of the substrate A10. The unevenly shaped portion A11 may be formed through etching of the substrate. Alternatively, the substrate A10 having the unevenly shaped portion A11 may be provided. The substrate A10 is formed of sapphire. The substrate A10 may be formed of a material other than sapphire; for example, Si or SiC.

3-2. Step of Forming Buffer Layer

Figure 5:
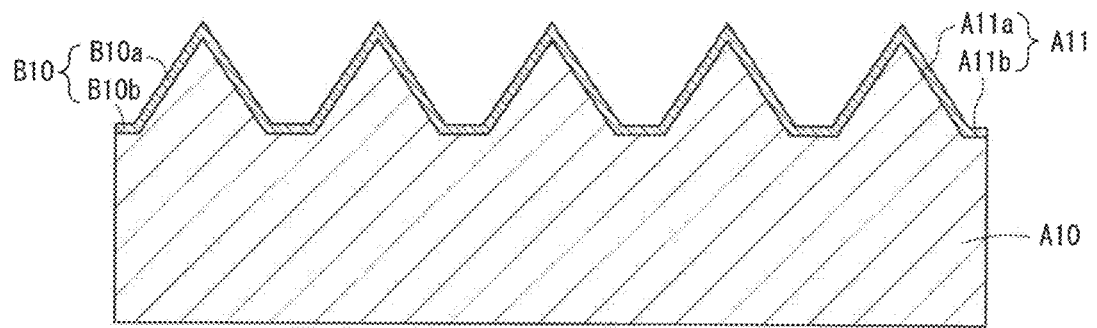
FIG. 5 illustrates the production method for the light-emitting device of the first embodiment (part 2)

Subsequently, as shown in FIG. 5, the buffer layer B10 is formed on the substrate A10 by means of, for example, MOCVD. The buffer layer B10 has a thickness considerably smaller than the height of the unevenly shaped portion of the substrate A10. Thus, the buffer layer B10 is formed so as to follow the shape of the unevenly shaped portion of the substrate A10. The buffer layer B10 having sloped portions B10a and a bottom portion B10b is thereby formed. The buffer layer B10 is formed of AlN.

3-3. Step of Forming Decomposition Layer

Figure 6:
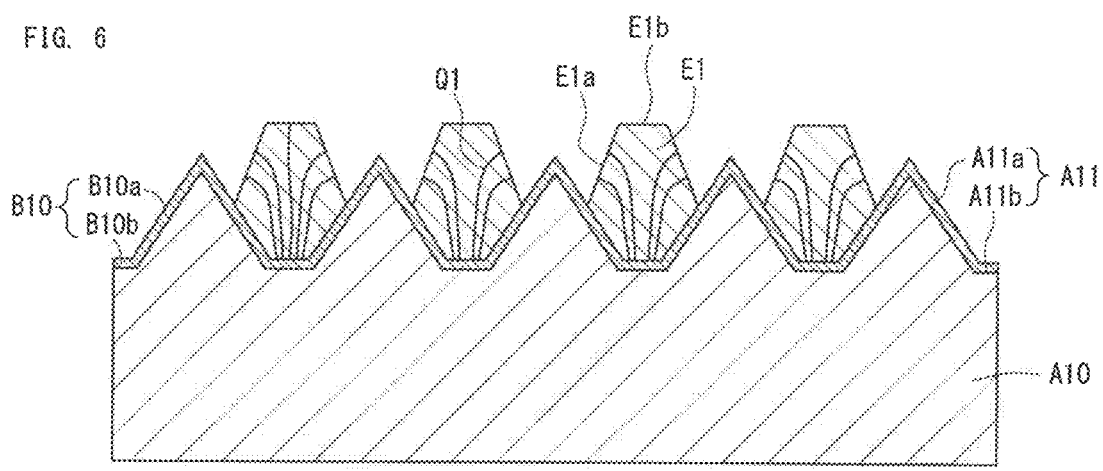
FIG. 6 illustrates the production method for the light-emitting device of the first embodiment (part 3)

As shown in FIG. 6, decomposition layers E1 are formed on the bottom portion B10b and the sloped portions B10a of the buffer layer B10. InGaN layers are formed as the decomposition layers E1 by means of MOCVD. The InGaN layers are thermally decomposed at a relatively low temperature. The thus-formed decomposition layers E1, which are semiconductor layers, are removed through an etching step described below. That is, the decomposition layers E1 are subjected to at least one of thermal decomposition and decomposition by etching.

Each decomposition layer E1 is grown generally in the vertical direction at an initial stage of growth, and the decomposition layer E1 is grown generally in the horizontal direction at a later stage of growth. Thus, threading dislocations A1 extend toward a sloped face E1a. Each decomposition layer E1 is grown from the bottom portion B10b of the buffer layer B10 provided on the substrate A10. Consequently, the decomposition layer E1 is formed on the bottom portion A11b of the substrate A10 and a portion of the adjacent protrusions A11a.

The thermal decomposition temperature of the decomposition layers E1 is lower than that of the bridging portions C10 (protrusions 190) described later. The growth temperature of the decomposition layers E1 is 750° C. to 1,150° C., preferably 900° C. to 1,150° C., more preferably 1,000° C. to 1,120° C.

3-4. Step of Forming Protrusion (Step of Forming Bridging Portion)

Figure 7:
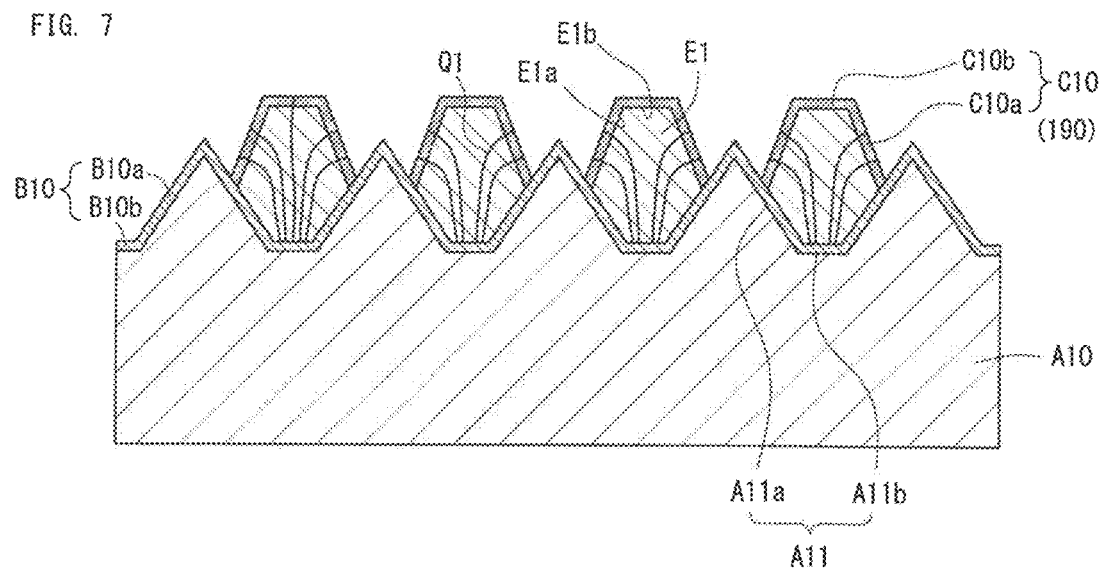
FIG. 7 illustrates the production method for the light-emitting device of the first embodiment (part 4)

Subsequently, as shown in FIG. 7, the bridging portions C10 are formed on the decomposition layers E1. The bridging portions C10 will later be protrusions 190. Each bridging portion C10 has a leg portion C10a and a top portion C10b. The bridging portions C10 may be formed by means of MOCVD. Alternatively, the bridging portions C10 may be formed by means of sputtering. As described above, the bridging portions C10 are formed of AlN. The bridging portions C10 are formed so as to cover the decomposition layers E1. The threading dislocations Q1 extend toward the leg portions C10a of the bridging portions C10.

3-5. Etching Step

Figure 8:
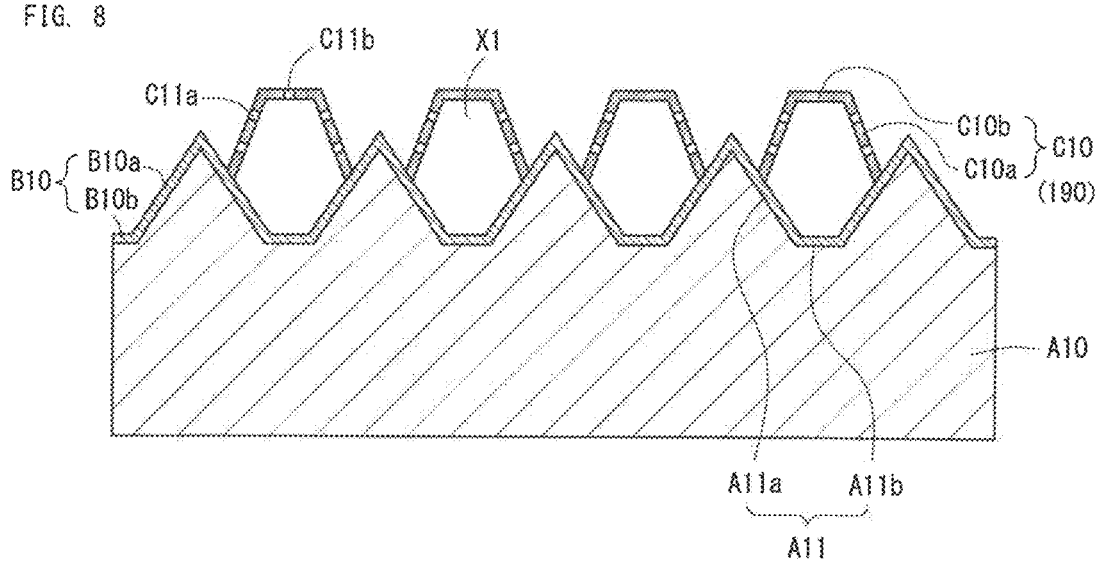
FIG. 8 illustrates the production method for the light-emitting device of the first embodiment (part 5)

Subsequently, as shown in FIG. 8, the decomposition layers E1 are etched. A gas mixture containing $H_2$ gas and at least one of $N_2$ gas and $NH_3$ gas is supplied for the etching. $H_2$ gas contained in the gas mixture generally etches the decomposition layers E1. Thus, the partial pressure of $H_2$ gas is preferably increased. However, the supply of $H_2$ gas alone may cause leaching of Ga metal in the form of droplets. Therefore, $N_2$ gas or $NH_3$ gas is preferably supplied in addition to $H_2$ gas.

The substrate temperature is adjusted to a temperature equal to or higher than the thermal decomposition temperature of the decomposition layers E1 and lower than the thermal decomposition temperature of the bridging portions C10. Therefore, the surfaces of the bridging portions C10 are etched from the threading dislocations Q1. Consequently, through holes C11a are provided in the leg portions C10a of the bridging portions C10, and through holes C11b are provided in the top portions C10b of the bridging portions C10.

After this, the decomposition layers E1 are thermally decomposed and etched from the thorough holes C11a and C11b. The decomposition layers E1 are thermally decomposed and etched by means of $H_2$ gas. Since the bridging portions C10 are not thermally decomposed, the bridging portions C10, which have the through holes C11a and C11b, remain after the etching. Thus, the first voids X1 are formed, each of which is defined by the substrate A10 and the bridging portion C10.

Preferably, the gas supplied in the etching step does not contain oxygen. Oxygen oxidizes AlN on the surfaces of the bridging portions C10 to thereby form AlON. The presence of AlON probably causes inversion of the polarity of a semiconductor layer above the bridging portions C10. Thus, the formation of AlON on the surfaces of the bridging portions C10 generates a polarity-inverted site and a non-polarity-inverted site in the semiconductor layer D10. Accordingly, the semiconductor layer D10 formed above the bridging portions C10 exhibits poor crystallinity. Thus, preferably, the gas supplied in the etching step does not contain oxygen. In the case where the substrate A10 contains oxygen atoms, oxygen atoms may remain in the reaction furnace. The remaining oxygen atoms may react with AlN on the surfaces of the bridging portions C10 to thereby form AlON. Thus, preferably, the etching step is immediately followed by the subsequent step for preventing the formation of AlON.

3-6. Step of Forming N-type Semiconductor Layer

The n-type semiconductor layer 180 is formed on the bridging portions C10 (protrusions 190). For example, an n-type contact layer, an n-side electrostatic breakdown preventing layer, and an n-side superlattice layer are formed in this order. The n-type semiconductor layer 180 is grown from the top surfaces C10b of the bridging portions C10.

The semiconductor layer is slightly grown from the leg portions C10a of the bridging portions C10. However, the growth from the leg portions C10a of the bridging portions C10 is considerably smaller than the growth from the top surfaces C10b of the bridging portions C10. Most of the threading dislocations Q1 extend toward the leg portions C10a of the bridging portions C10. Accordingly, the threading dislocations barely extend into the n-type semiconductor layer 180. The n-type semiconductor layer 180 is grown in the horizontal direction at least at an initial stage of growth; hence, the through holes C11b of the top portions C10b are effectively filled. Thus, the resultant semiconductor layer exhibits very low threading dislocation density.

Figure 9:
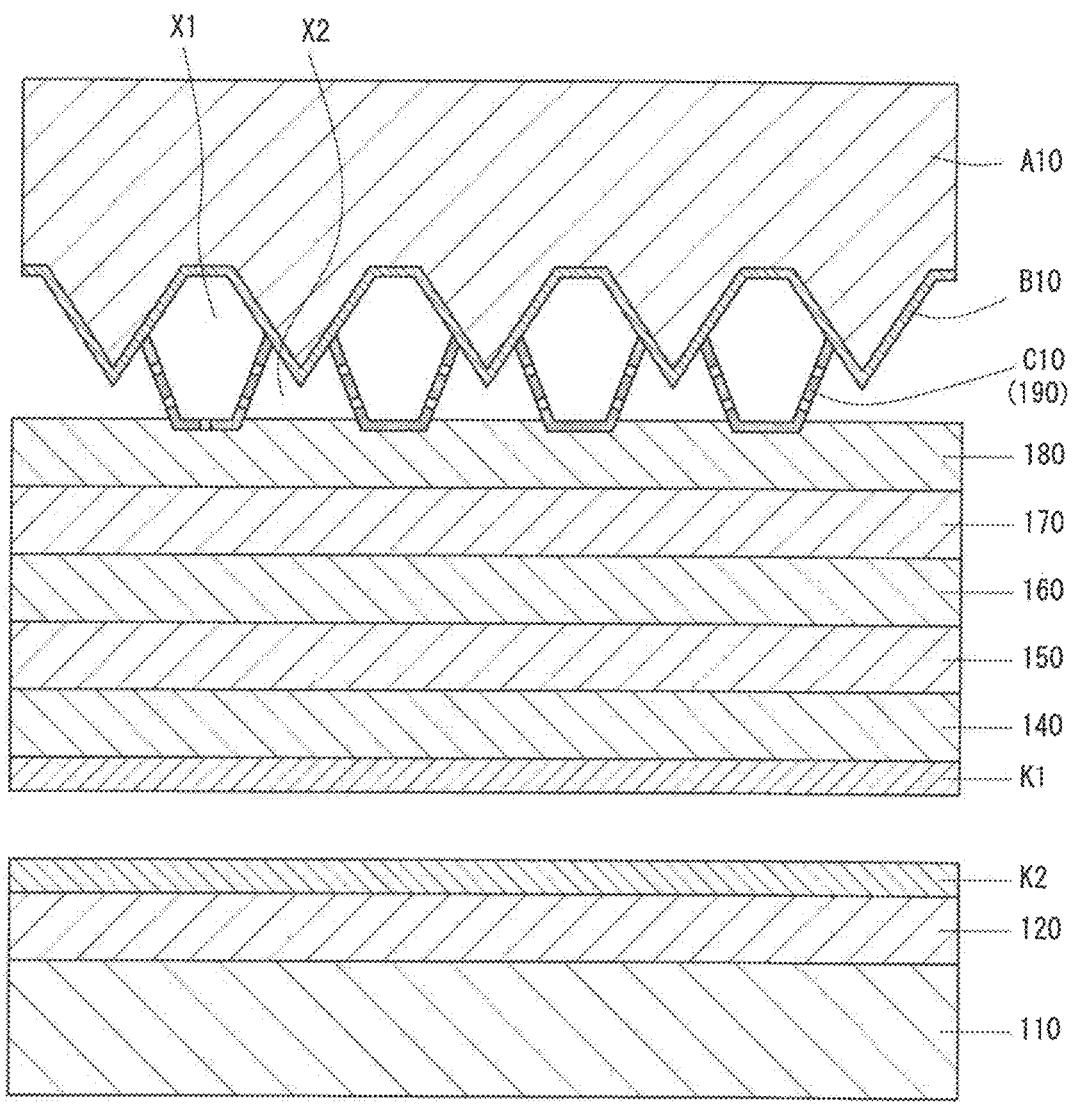
FIG. 9 illustrates the production method for the light-emitting device of the first embodiment (part 6)

The second voids X2 are provided in association with the growth of the n-type semiconductor layer 180 (see FIG. 9). Each second void X2 is defined by the leg portion C10a of the bridging portion C10, a portion around the top of the substrate A10, and the n-type semiconductor layer 180.

3-7. Step of Forming Light-emitting Layer

Thereafter, the light-emitting layer 170 is formed on the n-type semiconductor layer 180.

3-8. Step of Forming P-type Semiconductor Layer

Subsequently, the p-type semiconductor layer 160 is formed on the light-emitting layer 170 by sequentially depositing, for example, a p-side cladding layer and a p-type contact layer.

3-9. Step of Forming Electrically Conductive Reflective Film

Subsequently, the electrically conductive reflective film 150 is formed on the p-type semiconductor layer 160.

3-10. Step of Forming Bonding Layer.

Subsequently, as shown in FIG. 9, a second conductive metal layer 140 and a low-melting metal layer K1 are formed in this order on the electrically conductive reflective film 150. A first electrically conductive metal layer 120 and a low-melting metal layer K2 are formed in this order on the support substrate 110. The low-melting metal layer K1 formed on the substrate A10 side and the low-melting metal layer K2 formed on the support substrate 110 side are made to face each other. The low-melting metal layer K1 and the low-melting metal layer K2 are bonded. The low-melting metal layers K1 and K2 are, for example, solder. Thus, the low-melting metal layers K1 and K2 are integrated into a conductive bonding layer 130 after bonding.

3-11. Step of Separating Substrate

Subsequently, the substrate A10 is separated from the bridging portions C10. For example, the main surface of the substrate A10 is irradiated with a laser beam. The laser beam is a KrF high-output pulse laser beam having a wavelength of 248 nm. The laser beam may be, for example, a YAG laser beam (355 nm, 266 nm), a XeCl laser beam (308 nm), or an ArF laser beam (155 nm). Any other laser beam having a wavelength shorter than 365 nm may be used.

The bonding region between the substrate A10 and the protrusions 190 has a sufficiently small area. Thus, the substrate A10 is readily removed from the protrusions 190, resulting in separation of the substrate A10 and exposure of the protrusions 190.

3-12. Cleaning Step

Thereafter, the surfaces of the n-type semiconductor layer 180 and the protrusions 190 are cleaned. Specifically, the surfaces are cleaned with an aqueous HCl solution or an aqueous TMAH solution.

3-13. Step of Forming Electrode

Subsequently, the p-electrode P1 is formed on the surface of the support substrate 110 opposite the bonding layer 120. The n-electrode N1 is then formed on the n-type semiconductor layer 180.

3-14. Other Steps

In addition, a protective film may be formed so as to cover the entire surface of the light-emitting device 100.

4. Modifications 4-1. Material of Protrusion

In the first embodiment, the protrusions 190 are composed of an AlGaN layer. The thermal decomposition temperature of the protrusions 190 is higher than that of the decomposition layers E1. The protrusions 190 may be composed of an AlGaInN layer. The protrusions 190 preferably contain an Al-containing Group III nitride. The protrusions 190 may be formed of GaN or InGaN, which depends on the material for the decomposition layers E1.

The protrusions 190 may be composed of an AlN layer. AlN is an insulator. In this case, the n-electrode N1 is formed on the n-type semiconductor layer 180. A portion of the protrusions 190 may be removed.

4-2. Area of Flat Portion of Protrusion

The area of the flat portion 192 of the protrusions 190 that are in contact with the n-type semiconductor layer 180 is preferably smaller than a half of the area of the main surface of the substrate A10. In such a case, the threading dislocations generated in the substrate A10 are less likely to propagate to the n-type semiconductor layer 180. As used herein, the "main surface" of the substrate A10 refers to the surface of the substrate A10 on which the protrusions 190 are bridged.

4-3. Absence of Flat Portion of Protrusion

Protrusions having no flat portion 192 may be formed. In such a case, the semiconductor layer is grown from a portion around the ends of the wall portions 191. In this case, return light is effectively reflected.

4-4. Thickness of Leg Portion and Top Portion of Bridging Portion

The thickness of the flat portion 192 of each protrusion 190 is preferably greater than that of the wall portion 191 of each protrusion 190. In such a case, the semiconductor layer having high crystallinity is likely to be grown from the flat portion 192.

4-5. One Body Bridging Portion

In the first embodiment, there are a plurality of bridging portions C10. Bridging portion C10 may be an integral layer (one body layer).

4-6. Protrusion Having Multilayer Structure

In the first embodiment, each protrusion 190 is formed of a single AlN layer. The protrusion 190 may have a multilayer structure. Alternatively, the protrusion 190 may have a superlattice structure. Preferably, the entire protrusion 190 does not have an excessively large thickness.

4-7. Facet Plane of Protrusion

The surface of the wall portion 191 of each protrusion 190 may be a facet plane; for example, (10-1X) plane or (11-2X) plane. The surface of the flat portion 192 of the protrusion 190 may also be a facet plane; for example, (0001) plane. In such a case, the protrusion 190 has a stable form.

4-8. Crack of Protrusion

Cracks may be intentionally generated in the protrusions 190. In such a case, each protrusion 190 has at least one crack. In this case, the light extraction surface Z1 has a more complicated shape. Thus, the light-emitting device exhibits higher light extraction performance. In the case where no cracks are generated, the semiconductor layer exhibits high crystal quality.

4-9. Material of Decomposition Layer

In the first embodiment, each decomposition layer E1 is an InGaN layer. The decomposition layer E1 may be a GaN layer. The decomposition layer E1 may be doped with Si or Mg. In particular, Si promotes a three-dimensional growth mode (anti-surfactant effect). Thus, the decomposition layer E1 is preferably doped with Si. Needless to say, the decomposition layer E1 preferably has a low thermal decomposition temperature. Hence, the decomposition layer E1 preferably contains In. The incorporation of Al tends to increase the thermal decomposition temperature. In the case where the decomposition layer E1 contains Al, the Al content of the decomposition layer E1 is preferably lower than that of the protrusions 190. The decomposition layer E1 may be formed of a material other than a Group III nitride (e.g., TiN or SiNx), so long as the decomposition layer E1 has a thermal decomposition temperature lower than that of the protrusions C10. The decomposition layer E1 is preferably formed of a Group III nitride semiconductor having a composition similar to that of the semiconductor layer formed later. The use of such a Group III nitride semiconductor can prevent the intrusion of impurities into the later-formed semiconductor layer. Thus, the decomposition layer E1 is preferably formed of InGaN.

4-10. Material of Buffer Layer

In the first embodiment, the buffer layer B10 is formed of AlN. The AlN layer includes a low-temperature buffer layer and a high-temperature buffer layer. The buffer layer B10 may be formed of (in place of AlN) a low-temperature GaN buffer layer, a BN layer, a TiN layer, an SiNx layer, or a mixture thereof.

4-11. Unevenly Shaped Portion of Substrate

In the first embodiment, the substrate A10 has a plurality of protrusions A11a and a bottom portion A11b. The protrusions A11a have a conical shape. The protrusions A11a may have a truncated conical shape, a polygonal conical shape, or a truncated polygonal conical shape. In such a case, the unevenly shaped portion of substrate A10 has a bottom portion and a plurality of protrusions extending from the bottom portion. The substrate may have dents instead of the protrusions A11a.

Figure 10:
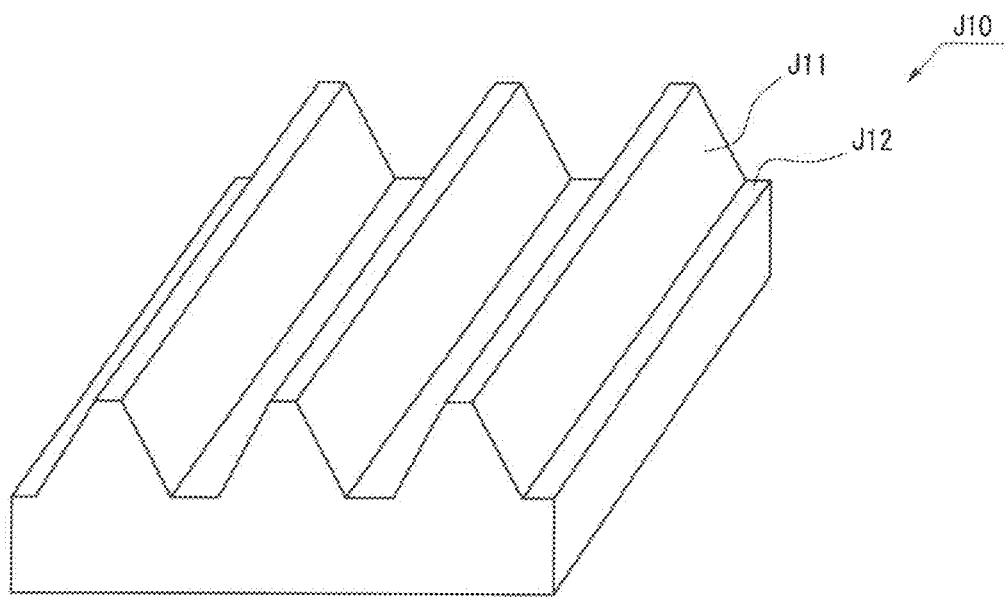
FIG. 10 is a perspective view of a growth substrate of a light-emitting device according to a modification of the first embodiment.

FIG. 10 is a perspective view of a substrate J10 of a light-emitting device according to a modification of the first embodiment. As shown in FIG. 10, the substrate J10 having a stripe-pattern unevenly shaped portion may be used. The substrate J10 has ridge-shaped protrusions J11 and a bottom portion J12.

Even in this case, the cross-sectional shape is as shown in FIG. 3. The wall portion 191 does not have a tubular shape. The wall portion 191 has two plates facing each other. A distance between the plates facing each other of each wall portion 191 decreases in a direction away from the surface 181 of the n-type semiconductor layer 180.

Thus, the technique of the first embodiment is applicable to another uneven substrate. The uneven substrate may have a non-periodic structure.

4-12. Decomposition Step (Etching Step)

The etching step involves supply of a gas mixture of $H_2$ gas and $N_2$ gas. However, $N_2$ gas may be supplied. In such a case, the decomposition layers E1 are not etched by $H_2$ gas, but are only thermally decomposed. In such a case, the decomposition layers E1 can be removed if the bridging portions C10 have a sufficiently small thickness.

4-13. Method for Removing Growth Substrate (Substrate Lift-off)

In the first embodiment, the substrate A10 is separated from the semiconductor layer by the laser lift-off process. Since the adhesion between the protrusions 190 and the substrate A10 is low, the substrate A10 is readily separated from the semiconductor layer. The substrate A10 may be separated from the semiconductor layer by, for example, an etching, tape lift-off, or ultrasonic process. Any other process may be used.

4-14. Electrically Conductive Transparent Film

An electrically conductive transparent film may be formed between the p-type semiconductor layer 160 and the electrically conductive reflective film 150. The electrically conductive transparent film is formed of, for example, any of ITO, IZO, ICO, ZnO, $TiO_2$, $NbTiO_2$, and $TaTiO_2$.

4-15. Absence of Second Void

The second voids X2 are formed in the production of the light-emitting device 100 of the first embodiment. However, the second voids X2 may be filled with the semiconductor layer. In such a case, regions surrounded by the first surfaces 191a of the protrusions 190 are filled with the n-type semiconductor layer 180. The height of the top portion C10b as measured from the substrate A10 is reduced and the semiconductor layer is grown in the horizontal direction on the top portion C10b so as to wrap around that the leg portions C10a of the bridging portions C10 or the protrusions A11a of the substrate A10. In this case, the through holes C11a of the leg portions C10a and the through holes C11b of the top portions C10b are blocked with the n-type semiconductor layer 180.

In such a case, the protrusions 190 exhibiting a low mechanical strength are reinforced by the n-type semiconductor layer 180. When the substrate A10 is separated from the semiconductor layer, the protrusions 190 can be suppressed from being broken. Accordingly, the protrusions 190 have more complicated irregularities. Thus, the light-emitting device 100 exhibits very higher external quantum efficiency.

4-16. Layered Structure of Semiconductor Layer

The light-emitting device 100 may have a layered structure different from that shown in FIG. 1. The semiconductor layer of the light-emitting device 100 may have any other layered structure.

4-17. Presence of Support Substrate

The light-emitting device 100 of the first embodiment has a support substrate 110. However, the support substrate 110 may be omitted by increasing the thickness of the semiconductor layer.

4-18. Combination

The above-described modifications may be used in any combination.

5. Summary of First Embodiment

The light-emitting device 100 of the first embodiment has the protrusions 190 having a complicated shape. Accordingly, light emitted from the light-emitting layer 170 is effectively scattered at the protrusions 190. Thus, the light-emitting device 100 exhibits high light extraction performance. Since the protrusions extend upward from the n-type semiconductor layer 180, the area of the semiconductor layer facing the outside of the light-emitting device is relatively large. Thus, the light-emitting device 100 exhibits high heat radiation.

The above-described embodiment is merely an example. Thus, needless to say, various modifications and variations may be made without departing from the scope of the embodiment. For example, the semiconductor layer is not necessarily grown through metal-organic chemical vapor deposition (MOCVD), and may be grown by any other crystal growth method using a carrier gas. Alternatively, the semiconductor layer may be formed by another epitaxial growth method, such as liquid-phase epitaxy or molecular beam epitaxy.

(Second Embodiment)

The second embodiment will now be described. The second embodiment involves the use of a growth substrate having truncated conical protrusions. Thus, the second embodiment will be described by focusing on the difference from the first embodiment.

1. Semiconductor Light-emitting Device

Figure 11:
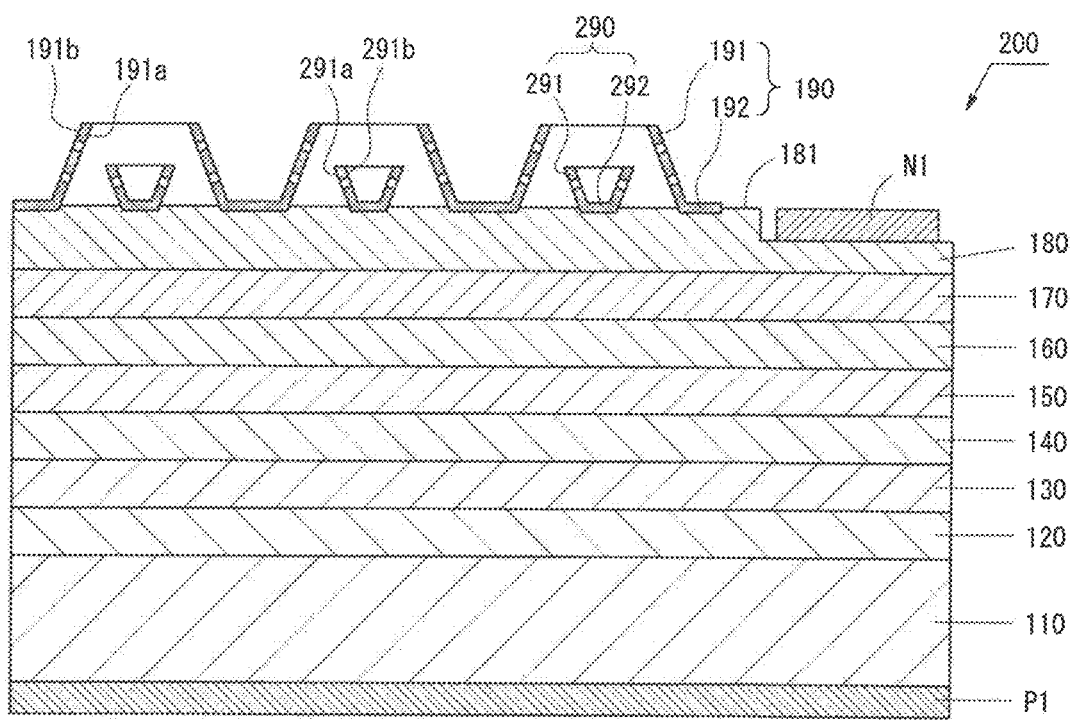
FIG. 11 schematically shows the configuration of a light-emitting device of a second embodiment.

FIG. 11 schematically shows the configuration of a light-emitting device 200 of the second embodiment. The light-emitting device 200 includes a p-electrode P1, a support substrate 110, a first conductive metal layer 120, a conductive bonding layer 130, a second conductive metal layer 140, an electrically conductive reflective film 150, and a p-type semiconductor layer 160, a light-emitting layer 170, an n-type semiconductor layer 180, protrusions 190, protrusions 290, and an n-electrode N1.

2. Protrusion

The light-emitting device 200 of the second embodiment has protrusions 190 and protrusions 290 smaller in size than the protrusions 190. The protrusions 190 are the first protrusions. The protrusions 290 are the second protrusions. The protrusions 290 extend upward from the surface of the n-type semiconductor layer 180. Each protrusion 290 has a wall portion 291 and a flat portion 292. Each wall portion 291 has a first surface 291a and a second surface 291b. The first surface 291a is a surface facing the n-type semiconductor layer 180 of the light-emitting device 200. The second surface 291b is a surface opposite to the first surface 291a. The inner diameter of the wall portions connected by the flat portion 292 increases in a direction from the surface 181 of the n-type semiconductor layer 180. The first surface 291a is the outside surface of the cylindrical shape having the inner diameter that increases in a direction away from the surface 181 of the n-type semiconductor layer 180.

The angle θ1 between the first surface 291a and the n-type contact layer 180 falls within a range of 10° to 85°. The angle θ1 is preferably 30° to 80°, more preferably 45° to 65°. Thus, each protrusion 290 has the first surface 291a which faces the n-type semiconductor layer 180 and makes an acute angle with the n-type semiconductor layer 180.

Figure 12:
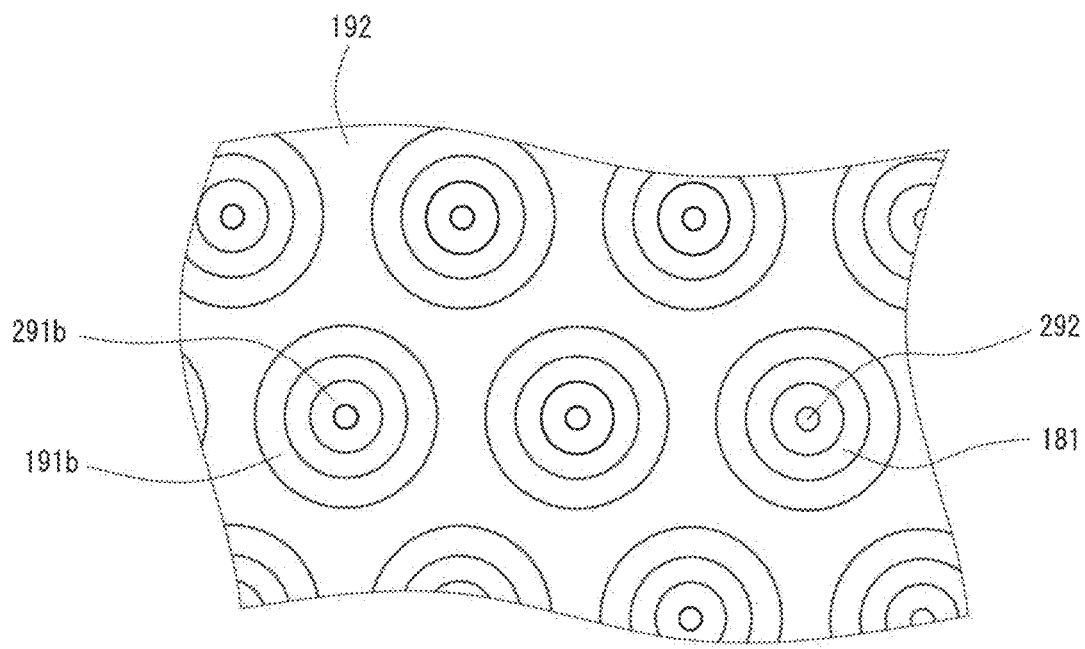
FIG. 12 is a view of the light-emitting device of the second embodiment as viewed from the n-electrode side.

FIG. 12 is a view of the light-emitting device 200 as viewed from the n-electrode N1 side. The protrusions 190 are arranged on the n-type semiconductor layer 180 in a honeycomb pattern. Each wall portion 191 has a tapered tubular shape whose inner diameter increases in a direction away from the surface 181 of the n-type semiconductor layer 180. Each protrusion 290 having a tapered tubular shape is disposed inside the protrusion 190 having a tapered tubular shape. That is, each protrusion 290 is disposed inside the tube shape of each protrusion 190.

3. Production Method for Semiconductor Light-emitting Device

The production method for the semiconductor light-emitting device will be described by focusing on the difference from the first embodiment.

Figure 13:
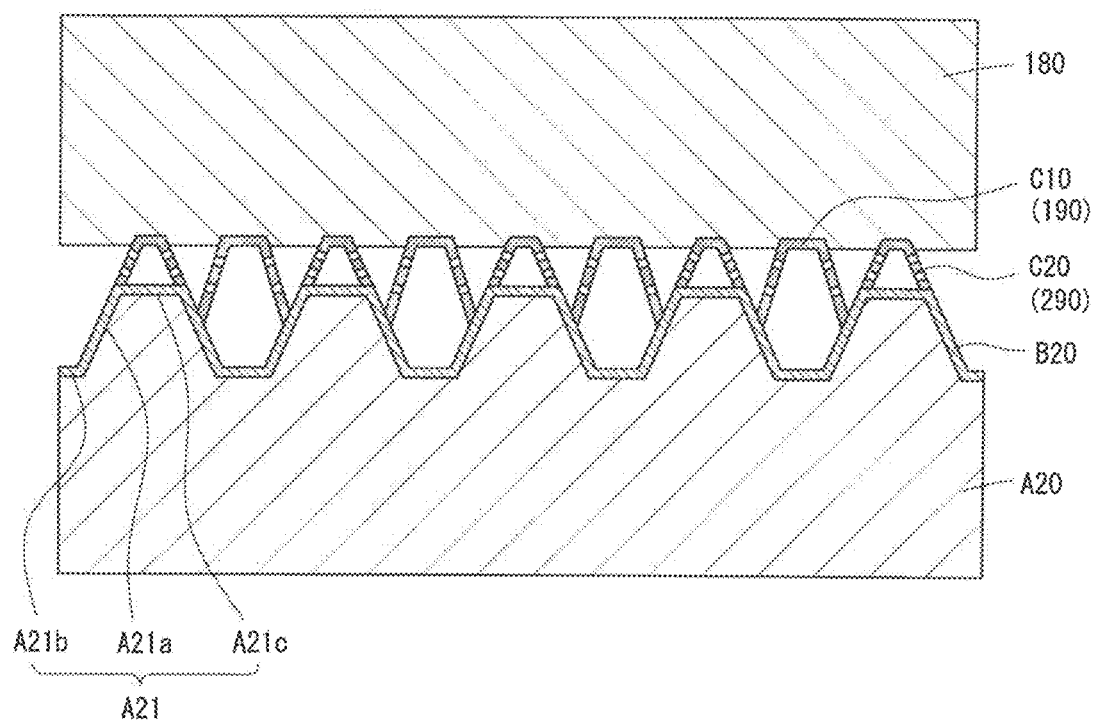
FIG. 13 illustrates a production method for the light-emitting device of the second embodiment.

FIG. 13 illustrates a production method for the light-emitting device 200 of the second embodiment. As described above, a substrate 20 having a truncated conical shape is used as a growth substrate in the second embodiment. The substrate A20 has sloped portions A21a, bottom portions A21b, and top portions A21c.

In the second embodiment, the decomposition layer is also grown on the top portion A21c of the substrate A20. Therefore, as shown in FIG. 13, the bridging portions C10 are grown on the slop portions A21a and the bridging portions C20 are grown on the top portions A21c. The bridging portions C10 will later be protrusions 190. The bridging portions C20 will later be protrusions 290. Each bridging portion C20 is smaller in size than each bridging portion C10.

4. Modifications

The second embodiment may use any combination of the modifications of the first embodiment.

5. Summary of Second Embodiment

The light-emitting device 200 of the second embodiment has the protrusions 190 and 290 having a complicated shape. Accordingly, light emitted from the light-emitting layer 170 is effectively scattered at the protrusions 190 and 290. Thus, the light-emitting device 200 exhibits high light extraction performance. The tubular shape of the protrusion 190 serves as an escape cone. Therefore, the protrusions 190 effectively reflect even the return light from the outside of the light-emitting device.

(Third Embodiment)

The third embodiment will now be described. The third embodiment involves the use of a flat growth substrate having no unevenly shaped portion on the main surface thereof. Thus, the third embodiment will be described by focusing on the difference from the first embodiment.

1. Semiconductor Light-emitting Device

Figure 14:
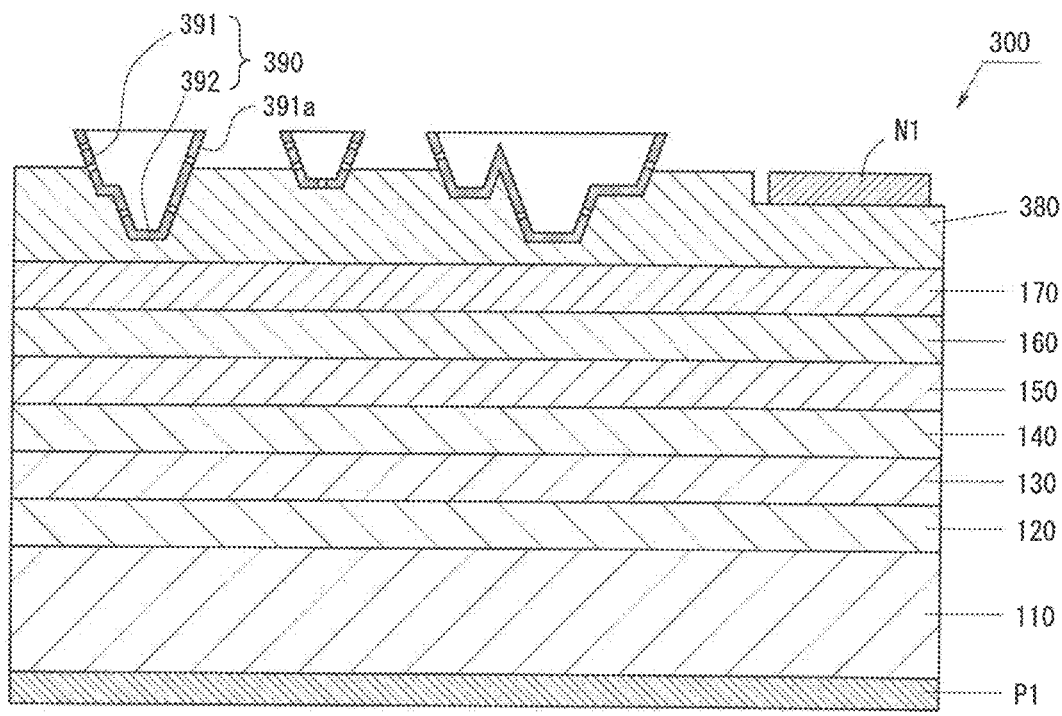
FIG. 14 schematically shows the configuration of a light-emitting device of a third embodiment.

FIG. 14 schematically shows the configuration of a light-emitting device 300 of the third embodiment. The light-emitting device 300 includes a p-electrode N1, a support substrate 110, a first conductive metal layer 120, a conductive bonding layer 130, a second conductive metal layer 140, an electrically conductive reflective film 150, a p-type semiconductor layer 160, a light-emitting layer 170, an n-type semiconductor layer 380, protrusions 390, and an n-electrode N1.

2. Protrusion

The protrusions 390 are arranged in an irregular and non-periodic manner on the n-type semiconductor layer 380. The wall portion 391 of the second protrusion 390 is formed from the wall portion 391 or the flat portion 392 of each first protrusion 390. That is, the first surface 391a of one wall portion 391 of the protrusions 390 is in contact with another wall portion 391 of the protrusions 390.

3. Production Method for Semiconductor Light-emitting Device

The production method for the semiconductor light-emitting device will be described by focusing on the difference from the first embodiment.

Figure 15:
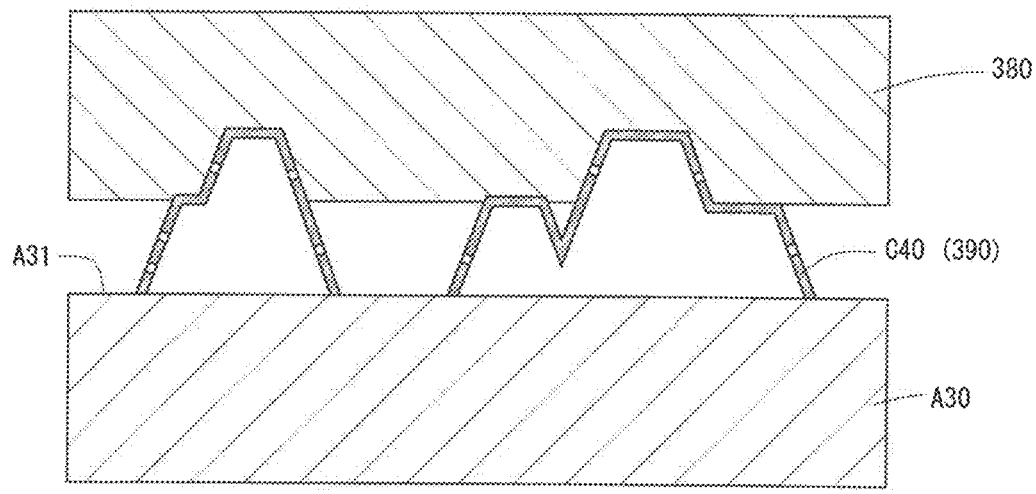
FIG. 15 illustrates a production method for the light-emitting device of the third embodiment.

FIG. 15 illustrates a production method for the light-emitting device 300 of the third embodiment. As described above, a flat substrate A30 is used as a growth substrate in the third embodiment. The substrate A30 has a flat surface A31. The flat surface A31 is the main surface of the substrate A30.

In the third embodiment, the bridging portions C40 are randomly grown on the flat surface A31 of the substrate A30. The bridging portions C40 will later be the protrusions 390. The bridging portions C40 are randomly generated. The bridging portions C40 are irregular in size. The n-type semiconductor layer 380 is grown on the bridging portions C40. The n-type semiconductor layer 380 has irregular uneven shape on the substrate A30 side so as to follow the irregular shape of the bridging portions C40.

4. Modifications

The third embodiment may use any combination of the modifications of the first embodiment.

5. Summary of Third Embodiment

The light-emitting device 300 of the third embodiment has the protrusions 390 having a complicated shape. Accordingly, light emitted from the light-emitting layer 170 is effectively scattered at the protrusions 390. Thus, the light-emitting device 300 exhibits high light extraction performance.

(Fourth Embodiment)

The fourth embodiment will now be described. In the fourth embodiment, ELO (Epitaxial Lateral Overgrowth) technique is employed. Thus, the fourth embodiment will be described by focusing on the difference from the first embodiment.

1. Semiconductor Light-emitting Device

Figure 16:
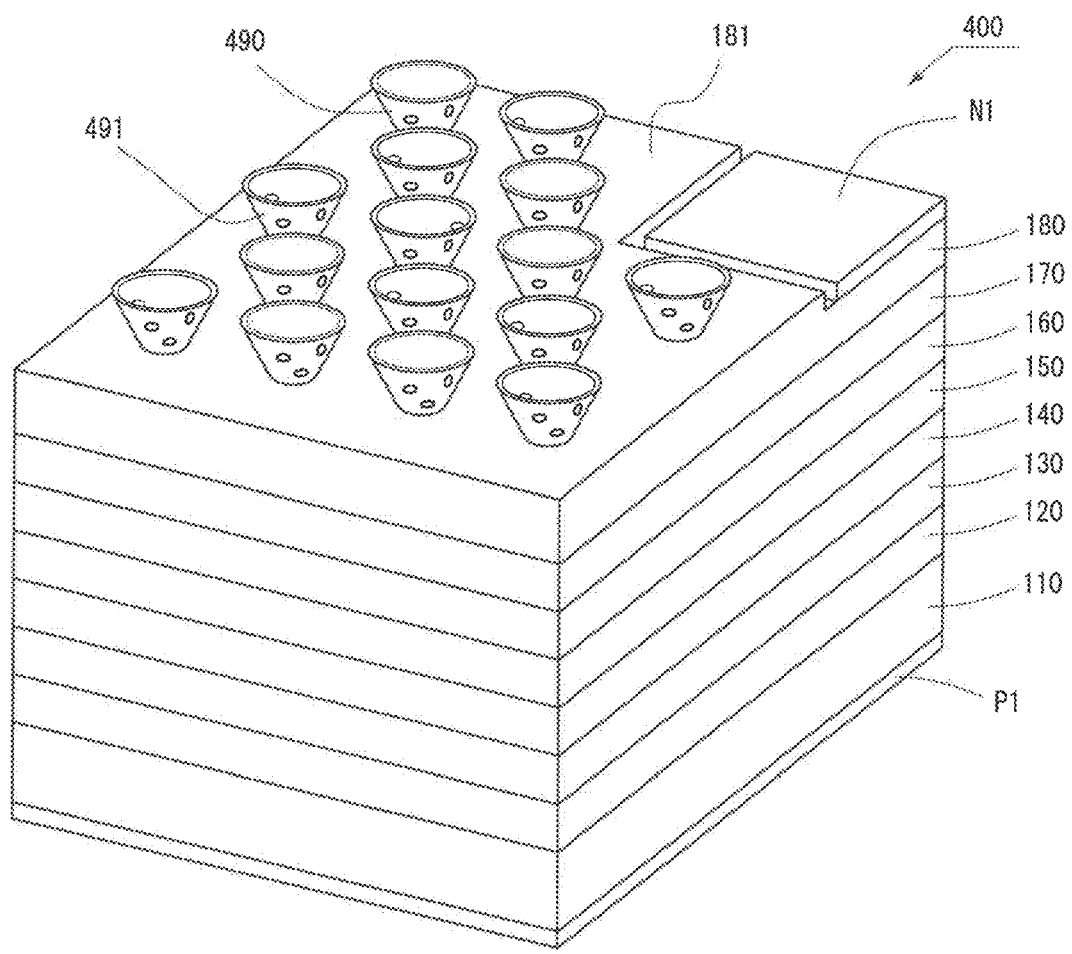
FIG. 16 is a perspective view of a light-emitting device of a fourth embodiment.

FIG. 16 is a perspective view showing the configuration of a light-emitting device of a fourth embodiment. As shown in FIG. 16, the light-emitting device 400 has protrusions 490 on the n-type semiconductor layer 180. Each protrusion 490 has a wall portion 491 and a flat portion. The wall portion 491 has a tubular shape. The inner diameter of the tubular wall portion 491 increases in a direction away from the surface of the n-type semiconductor layer 180.

2. Production Method for Semiconductor Light-emitting Device

The production method for the semiconductor light-emitting device will be described by focusing on the difference from the first embodiment.

Figure 17:
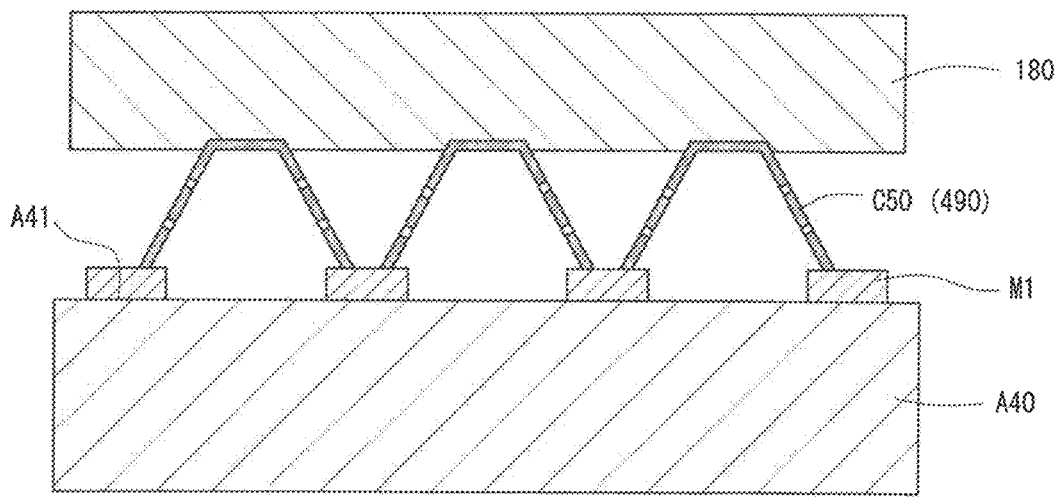
FIG. 17 illustrates a production method for the light-emitting device of the fourth embodiment.

FIG. 17 illustrates a production method for the light-emitting device of the fourth embodiment. A flat substrate A40 is used as a growth substrate in the fourth embodiment. The substrate A40 has a flat surface A41. The flat surface A41 is the main surface of the substrate A40.

2-1. Step of Forming Mask Layer

Mask layers M1 are formed on a portion of the flat surface A41 of the substrate A40 before growing the decomposition layer as shown in FIG. 17. The mask layers M1 are preferably formed in a periodic and regular manner. For example, the mask layers M1 are formed from $SiO_2$. Any other material may be used as long as it does not act as crystal nucleus in semiconductor.

2-2. Step of Forming Decomposition Layer

Subsequently, decomposition layers are formed so as to cover a portion of the top surfaces of the mask layers M1.

2-3. Step of Forming Protrusion (Step of Forming Bridging Portion)

The bridging portions C50 are then formed on the decomposition layers. In this case, the bridging portions C50 are in contact with the mask layers M1 at either of or both the flat surface and end surface. At this stage, each bridging portion C50 has the same shape as that of each protrusion 490. The bridging portion C50 is not strongly bonded to the mask layer M1.

3. Effects of Fourth Embodiment

The ELO technique allows to form protrusions having a more complicated shape. Many kinds of variations of protrusions can be formed by appropriately selecting the pattern of the mask layer Ml. Since the mask layer M1 is not strongly bonded to the n-type semiconductor layer 180, the substrate A40 can be readily removed from the semiconductor layer.

4. Modifications

The fourth embodiment may use any combination of the modifications of the first embodiment.

5. Summary of Fourth Embodiment

The light-emitting device 400 of the fourth embodiment has the protrusions 490 having a complicated shape. Accordingly, light emitted from the light-emitting layer 170 is effectively scattered at the protrusions 490. Thus, the light-emitting device 400 exhibits high light extraction performance.

EXAMPLES

1. Production of Sample

A sample was produced by the method for producing the light-emitting device 100 of the first embodiment. Thus, the growth substrate is a substrate having conical protrusions arranged in a honeycomb pattern. The buffer layer is a low-temperature AlN buffer layer. The protrusions (bridging portions) were formed from AlN through sputtering. Thereafter, semiconductor layers (including an n-type semiconductor layer) were formed. Subsequently, the growth substrate was removed from the n-type semiconductor layer through etching.

2. Image

Figure 18:
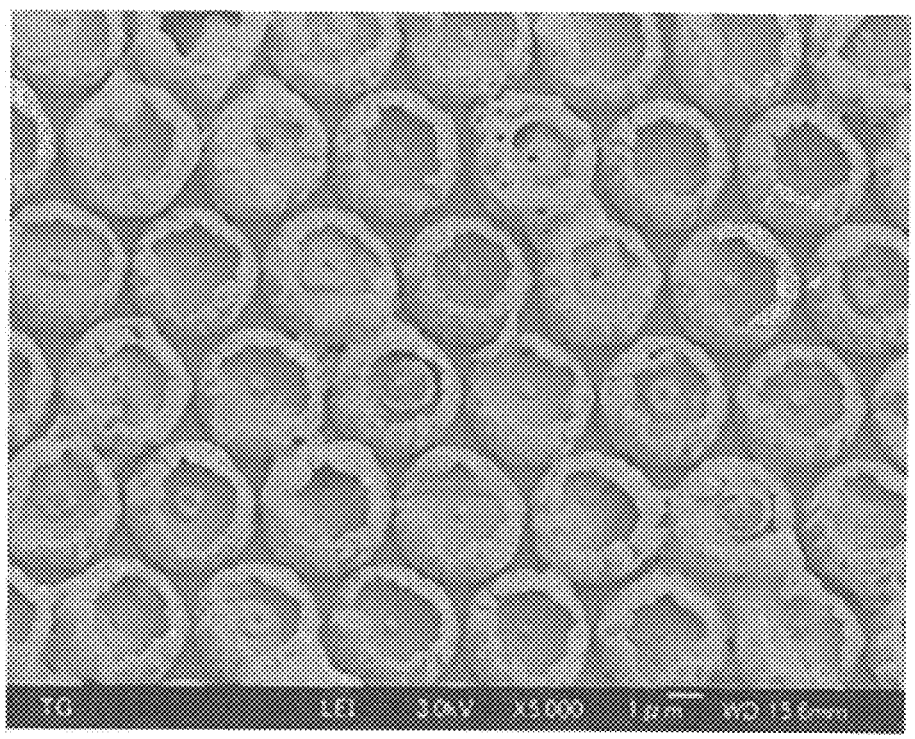
FIG. 18 is a scanning micrograph showing a portion corresponding to protrusions (part 1)
Figure 19:
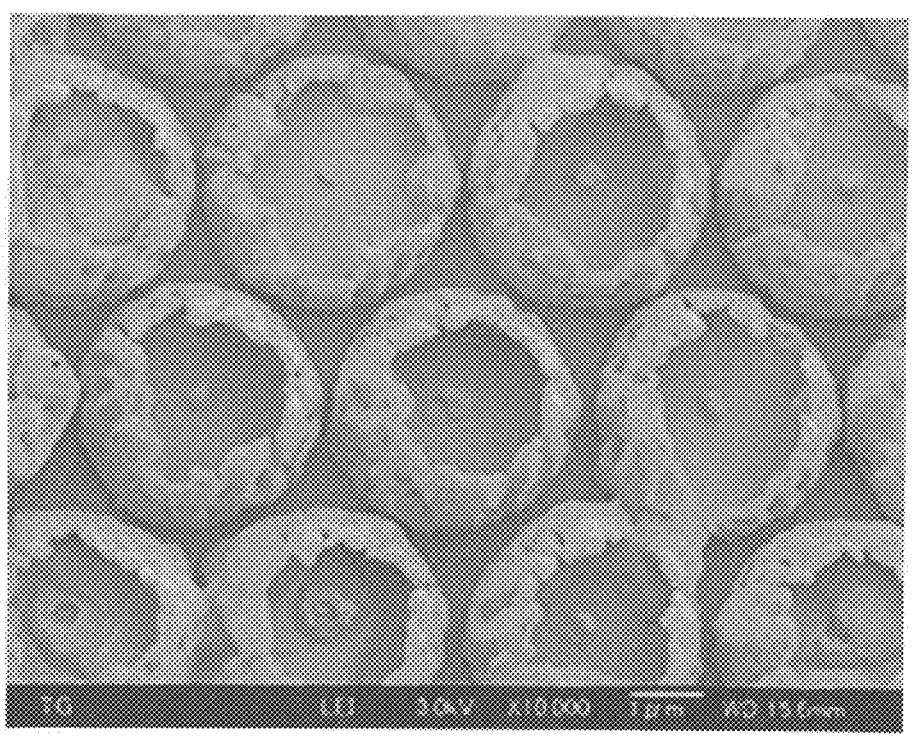
FIG. 19 is a scanning micrograph showing a portion corresponding to the protrusions (part 2).

FIG. 18 is a scanning micrograph showing a portion corresponding to the protrusions (part 1). FIG. 19 is a scanning micrograph showing a portion corresponding to the protrusions (part 2). As shown in FIGS. 18 and 19, each protrusion has an approximately cylindrical shape. The inner diameter of the cylindrical protrusion decreases in a direction away from the surface of the n-type semiconductor layer.

What is claimed is:

1. A Group III nitride semiconductor light-emitting device comprising:
   a first semiconductor layer of a first conductive type;
   a light-emitting layer on the first semiconductor layer; and
   a second semiconductor layer of a second conductive type on the light-emitting layer, wherein:
   a first protrusion extends upward from a surface of the second semiconductor layer;
   the first protrusion comprises a wall portion disposed so as to intersect with the surface of the second semiconductor layer;
   the wall portion comprises a first surface facing the second semiconductor layer;
   an angle between the first surface and the second semiconductor layer is 10° to 85°;
   the wall portion comprises a tubular shape; and
   an inner diameter of the tubular wall portion increases in a direction away from the surface of the second semiconductor layer.

2. A Group III nitride semiconductor light-emitting device according to claim 1, wherein a plurality of first protrusions are arranged in a non-periodic manner on the second semiconductor layer.

3. A Group III nitride semiconductor light-emitting device according to claim 1, wherein each first protrusion has a thickness of 0.25 nm to 100 nm at its thickest position.

4. A Group III nitride semiconductor light-emitting device according to claim 1, wherein each first protrusion comprises a facet plane on the surface thereof.

5. A Group III nitride semiconductor light-emitting device comprising:
   a first semiconductor layer of a first conductive type;
   a light-emitting layer on the first semiconductor layer; and
   a second semiconductor layer of a second conductive type on the light-emitting layer, wherein:
   a first protrusion extends upward from a surface of the second semiconductor layer;
   the first protrusion comprises a wall portion disposed so as to intersect with the surface of the second semiconductor layer;

the wall portion comprises a first surface facing the second semiconductor layer;
an angle between the first surface and the second semiconductor layer is 10° to 85°;
the wall portion comprises a tubular shape;
an inner diameter of the tubular wall portion decreases in a direction away from the surface of the second semiconductor layer;
a second protrusion is formed smaller in size than the first protrusion;
the second protrusion extends upward from the surface of the second semiconductor layer; and
the second protrusion is disposed inside the tubular shape of the first protrusion.

6. A Group III nitride semiconductor light-emitting device according to claim 5, wherein a plurality of first protrusions are arranged in a non-periodic manner on the second semiconductor layer.

7. A Group III nitride semiconductor light-emitting device according to claim 5, wherein each first protrusion has a thickness of 0.25 nm to 100 nm at its thickest position.

8. A Group III nitride semiconductor light-emitting device according to claim 5, wherein each first protrusion comprises a facet plane on the surface thereof.

9. A Group III nitride semiconductor light-emitting device comprising:
a first semiconductor layer of a first conductive type;
a light-emitting layer on the first semiconductor layer; and
a second semiconductor layer of a second conductive type on the light-emitting layer, wherein:
a first protrusion extends upward from a surface of the second semiconductor layer;
the first protrusion comprises a wall portion disposed so as to intersect with the surface of the second semiconductor layer;
the wall portion comprises a first surface facing the second semiconductor layer;
an angle between the first surface and the second semiconductor layer is 10° to 85° ;
the wall portion comprises a tubular shape;
an inner diameter of the tubular wall portion decreases in a direction away from the surface of the second semiconductor layer;
the first protrusion comprises a flat portion in contact with the second semiconductor layer;
wall portions are connected to one another via the flat portion;
the wall portion comprises first through holes;
the flat portion comprises second through holes; and
a density of the first through holes is higher than that of the second through holes.

10. A Group III nitride semiconductor light-emitting device according to claim 9, wherein both ends of each first through hole are open; and
one end of each second through hole is blocked with the second semiconductor layer.

11. A Group III nitride semiconductor light-emitting device according to claim 9, wherein a thickness of the flat portion of each first protrusion is greater than a thickness of the wall portion of said each first protrusion.

12. A Group III nitride semiconductor light-emitting device according to claim 9, wherein a plurality of first protrusions are arranged in a non-periodic manner on the second semiconductor layer.

13. A Group III nitride semiconductor light-emitting device according to claim 9, wherein each first protrusion has a thickness of 0.25 nm to 100 nm at its thickest position.

14. A Group III nitride semiconductor light-emitting device according to claim 9, wherein each first protrusion comprises a facet plane on the surface thereof.

* * * * *